(12) United States Patent
Huang et al.

(10) Patent No.: US 8,021,828 B2
(45) Date of Patent: Sep. 20, 2011

(54) PHOTORESIST COMPOSITIONS AND METHODS RELATED TO NEAR FIELD MASKS

(75) Inventors: Wu-Song Huang, Brewster, NY (US); Ranee Wai-Ling Kwong, Wappingers Falls, NY (US); Pushkara R. Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 745 days.

(21) Appl. No.: 12/034,971

(22) Filed: Feb. 21, 2008

(65) Prior Publication Data
US 2009/0214959 A1 Aug. 27, 2009

(51) Int. Cl.
*G03F 7/26* (2006.01)
(52) U.S. Cl. ........................................ 430/313; 430/394
(58) Field of Classification Search .......................... None
See application file for complete search history.

(56) References Cited

U.S. PATENT DOCUMENTS

| | | | |
|---|---|---|---|
| 4,362,809 A | 12/1982 | Chen et al. | |
| 4,543,319 A | 9/1985 | Chao et al. | |
| 4,906,552 A | 3/1990 | Ngo et al. | |
| 5,290,397 A | 3/1994 | Ober et al. | |
| 5,455,145 A | 10/1995 | Tarumoto | |
| 6,037,097 A | 3/2000 | Bucchignano et al. | |
| 6,043,003 A | 3/2000 | Bucchignano et al. | |
| 7,300,741 B2 | 11/2007 | Huang et al. | |
| 2006/0073422 A1 | 4/2006 | Edwards et al. | |

*Primary Examiner* — Kathleen Duda
(74) *Attorney, Agent, or Firm* — Schmeiser, Olsen & Watts;; Ian D. MacKinnon (57) ABSTRACT

A structure and a photolithography method. The method includes forming a first layer of a first photoresist including a first polymer and a first photosensitive acid generator. A second layer of a second photoresist, including a second polymer having at least one phenyl or phenolic moiety, is formed directly onto the first layer. The second layer is patternwise imaged, resulting in exposing at least one first portion. The first portion is removed, revealing at least one first region of the first layer. A second portion of the second layer remains forming a structure having opaque regions. The structure and first region are exposed. The opaque regions shield from radiation at least one second region of the first layer, resulting in producing acid in the first region and in the structure. The structure and base-soluble regions of the first layer are removed. A structure is also described.

12 Claims, 4 Drawing Sheets

PHOTORESIST COMPOSITIONS AND METHODS RELATED TO NEAR FIELD MASKS

FIELD OF THE INVENTION

The embodiments herein generally relate to photoresist compositions and methods of photolithography using the same, more specifically to near field masks methods and compositions related thereto.

BACKGROUND OF THE INVENTION

Traditional far field lithography is diffraction limited. To print high resolution images, high numerical aperture (NA) exposure system are often required. The increase of NA has created various challenges, such as smaller dose latitude, smaller depth of field (DOF) and higher reflectivity from substrate, etc. Recently, near field imaging has been reported as a method to print features smaller than the diffraction limit of optical lithography. However, contact or proximity printing has been known to cause resist defects and mask contamination, and portable conformable mask (PCM) proposes only the use of different exposure sources between 1st and 2nd exposures, requiring the use of two steppers and transportation of wafers between the two stepper stations. In addition, the long wavelength exposures (e.g. 365 nanometers and 436 nanometers) provide low resolution patterns. There exists a need for efficient methods and related photoresists for near field imaging with high pattern resolution.

SUMMARY OF THE INVENTION

The present invention relates to a photolithography method comprising:
forming a first layer of a first photoresist onto a substrate, said first photoresist comprising a first polymer and a first photosensitive acid generator;
forming a second layer of a second photoresist directly onto said first layer, said second photoresist comprising a second polymer and a second photosensitive acid generator, said second polymer having at least one repeating unit comprising a moiety selected from the group consisting of:

wherein R is selected from the group consisting of hydrogen, halogens, alkyl groups, aromatic groups, and combinations thereof;
patternwise imaging said second layer through a patterned mask, resulting in exposing at least one first portion of said second layer to a first dose of radiation having a wavelength or range of wavelengths, wherein at least one second portion of said second layer is not exposed to said radiation, said second photosensitive acid generator producing an acid catalyst in said exposed at least one first portion of said second layer, resulting in rendering said exposed first portion soluble in aqueous base developer;
removing said at least one first portion of said second layer, resulting in revealing at least one first region of said first layer directly beneath said first portion, said at least one second portion of said second layer remaining after said removing resulting in forming a structure having masked regions comprising said at least one second portion of said second layer and unmasked regions comprising gaps formed by said removing said at least one first portion of said second layer;
exposing said structure and said at least one first region of said first layer to a second dose of said radiation, said masked regions of said structure shielding, from said second dose of radiation, at least one second region of said first layer directly beneath said masked regions, resulting in said first photosensitive acid generator producing an acid catalyst in said exposed at least one first region of said first layer and said second photosensitive acid generator producing an acid catalyst in said structure; and
removing said structure and base-soluble regions of said first layer.

The present invention relates to a structure, comprising:
a first layer of a first photoresist disposed directly onto a substrate, said first photoresist comprising a photosensitive acid generator and a polymer, said polymer having at least one repeating unit having a phenolic moiety or a phenyl moiety, said polymer having at least one repeating unit having an acid labile moiety, said first layer comprising transparent and opaque regions, said transparent regions essentially transparent to radiation having a wavelength or range of wavelengths, said opaque regions substantially opaque to said radiation; and
a beam of said radiation passing through said transparent regions.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

Described herein are photolithographic methods and compositions relating to a first photoresist layer formed on a substrate and a second photoresist layer formed directly onto the first layer. The second layer may function as a near field mask shielding or blocking a portion of the first photoresist layer from radiation exposed to the substrate and layers thereon.

The substrates described herein may include a semiconducting material, an insulating material, a conductive material or any combination thereof, including multilayered structures. Thus, for example, the substrate may comprise a semiconducting material such as Si, SiGe, SiGeC, SiC, GaAs, InAs, InP and other III/V or II/VI compound semiconductors. The substrate may comprise, for example, a silicon wafer or process wafer such as that produced in various steps of a semiconductor manufacturing process, such as an integrated semiconductor wafer. The substrate may comprise a layered substrate such as, for example, Si/SiGe, Si/SiC, silicon-on-insulators (SOIs) or silicon germanium-on-insulators (SGOIs). The substrate may comprise layers such as a dielectric layer, a barrier layer for copper such as SiC, a metal layer such as copper, a silicon layer, a silicon oxide layer, the like, or combinations thereof. The substrate may comprise an insulating material such as an organic insulator, an inorganic insulator or a combination thereof including multilayers. The substrate may comprise a conductive material, for example, polycrystalline silicon (polySi), an elemental metal, alloys of elemental metals, a metal silicide, a metal nitride, or combinations thereof, including multilayers. The substrate may comprise ion implanted areas, such as ion implanted source/drain areas having P-type or N-type diffusions active to the surface of the substrate.

In some embodiments, the substrate may include a combination of a semiconducting material and an insulating material, a combination of a semiconducting material and a conductive material or a combination of a semiconducting material, an insulating material and a conductive material. An example of a substrate that includes a combination of the above is an interconnect structure.

The layers described herein may be formed by a process such as spin coating, spray coating, dip coating, doctor-blading, roll coating, and the like, which may be used individually or in one or more combination thereof in accordance with the methods of the present invention. The layers may be baked following forming (post-applying baked, PAB) to remove any solvent from the layer and improve the coherence of the layer. The temperature of the PAB may be in a range from about 70° C. to about 150° C., such as from about 90° C. to about 130° C.

The photosensitive acid generators (PAG) described herein generating or otherwise produce an amount of acid (such as 1 mole of acid per mole of PAG, for example) upon exposure to a dose of electromagnetic radiation, such as visible, ultraviolet (UV) and extreme ultraviolet (EUV), for example. The PAG may comprise, for example, triphenyl sulfonium nonaflate (TPSN), (trifluoro-methylsulfonyloxy)-bicyclo[2.2.1]hept-5-ene-2,3-dicarboximide (MDT), N-hydroxy-naphthalimide dodecane sulfonate (DDSN), onium salts, aromatic diazonium salts, sulfonium salts, diaryliodonium salts, sulfonic acid esters of N-hydroxyamides, imides, or combinations thereof.

The term substantially insoluble, as used herein, is intended to comprise having such a small degree of solubility so as to not affect the quality of an image formed from a photoresist by loss of material (e.g., polymer, photoresist, etc.) through dissolution into aqueous base solution or photoresist solvents from regions of the photoresist layer not containing photosensitive acid generator derived acid. The term substantially soluble, as used herein, is intended to comprise having a high enough degree of solubility in aqueous base solutions or solvents so to allow all or almost all (i.e., any remaining material is present such a small amounts so as to not interfere with subsequent processing steps) of the material (e.g., polymer, photoresist, etc.) in regions containing acid derived from the photosensitive acid generator to dissolve into aqueous base solutions or photoresist solvents. In the context of photoresist formulation and semiconductor processing, the term substantially insoluble is intended to include polymers completely or almost completely insoluble in photoresist solvents. In the context of photoresist formulation and semiconductor processing, the term substantially soluble is intended to include polymers completely or almost completely soluble in photoresist solvents. In general, the polymer dissolution rates affect the dissolution rates of the photoresist layers most strongly; thus, a substantially insoluble polymer may render substantially insoluble a photoresist comprising that polymer. Substantially insoluble photoresists have a dissolution rate of less than about 0.2 nanometers/second (nm/s) in solvent or aqueous base, while substantially soluble photoresists have a dissolution rate of greater than about 5 nm/s in solvent or aqueous base. Photosensitive acid generators, quencher and other additives may also alter the dissolution rates of the final photoresist layer.

The photoresists described herein may further comprise one or more surfactants. Surfactants may be used to improve coating uniformity, and may include ionic, non-ionic, monomeric, oligomeric, and polymeric species, or combinations thereof. Examples of possible surfactants include fluorine-containing surfactants such as the FLUORAD series available from 3M Company in St. Paul, Minn., and siloxane-containing surfactants such as the SILWET series available from Union Carbide Corporation in Danbury, Conn.

The photoresists described herein may include a casting solvent to dissolve the other components, so that the photoresist may be applied evenly on the substrate surface to provide a defect-free coating. Where the photoresist is used in a multilayer imaging process, the solvent used in the imaging layer may not be a solvent to the underlayer materials, otherwise unwanted intermixing may occur. Some examples of suitable casting solvents include ethers, glycol ethers, aromatic hydrocarbons, ketones, esters, ethyl lactate, gamma-butyrolactone (GBL), cyclohexanone, ethoxyethylpropionate (EEP), a combination of EEP and GBL, and propylene glycol methyl ether acetate (PGMEA). The present invention is not limited to the selection of any particular solvent.

The photoresists described herein may include a base quencher, sensitizers or other expedients known in the art. The compositions of the photoresists described herein are not limited to any specific selection of these expedients, where base quenchers may comprise aliphatic amines, aromatic amines, carboxylates, hydroxides, or combinations thereof. For example base quenchers may include: dimethylamino pyridine, 7-diethylamino-4-methyl coumarin (Coumarin 1), tertiary amines, sterically hindered diamine and guanidine bases such as 1,8-bis(dimethylamino)naphthalene (PROTON SPONGE), berberine, or polymeric amines such as in the PLURONIC or TETRONIC series commercially available from BASF. Tetra alkyl ammonium hydroxides or cetyltrimethyl ammonium hydroxide may be used as a base quencher when the PAG is an onium salt.

The photoresists described herein are not limited to any specific proportions of the various components. The photoresist may comprise about 1% by weight (wt %) to about 30 wt % of polymer based on the total weight of the composition, such as from about 2 wt % to about 15 wt %. The photoresist composition may comprise from about 0.5 wt % to about 30 wt % photosensitive acid generator based on the weight of the polymer in the composition, such as from about 0.5 wt % to about 20 wt %. The photoresist composition may comprise from about 70 wt % to about 99 wt. % solvent based on the total weight of the composition, such as from about 85 wt % to about 98 wt %. The photoresist composition may further include about 0.1 wt % to about 1.0 wt % of base quencher based on the total weight of the polymer in the composition. The photoresist composition may further include about 0.001 wt % to about 0.1 wt % of surfactant based on the total weight of polymer in the composition.

Radiation as described herein, such as for patternwise imaging and/or exposure of photoresists, may comprise electromagnetic radiation, such as ultraviolet (UV) light having wavelengths such as approximately 436 nanometers (nm) and 365 nm, deep-ultraviolet (DUV) light having wavelengths such as approximately 257 nm, 248 nm, 193 nm, and 157 nm, extreme-ultraviolet (EUV) light having wavelengths such as between approximately 4 nm and approximately 70 nm (such as approximately 13.5 nm), x-rays, combinations of these, and the like. Various wavelengths of radiation may be used such as 313 nm, 334 nm, 405 nm, and 126 nm etc., where the sources may be mainly from specific mercury emission lines or specific lasers. For high performance lithography, single wavelength and/or narrow band radiation sources may be used. For less stringent conditions, a broad band multiple wavelength source may be used. The photoresist compositions of the present invention may be patternwise imaged using particle beams such as electron beam, ion beam, combinations of these, and the like. The appropriate radiation or particle beam type(s) may depend on the components of the overall photoresist composition (e.g., the selection of polymer, photosensitive acid generator (PAG), base (or quencher), surfactant, solvent, etc.).

Figure 1:
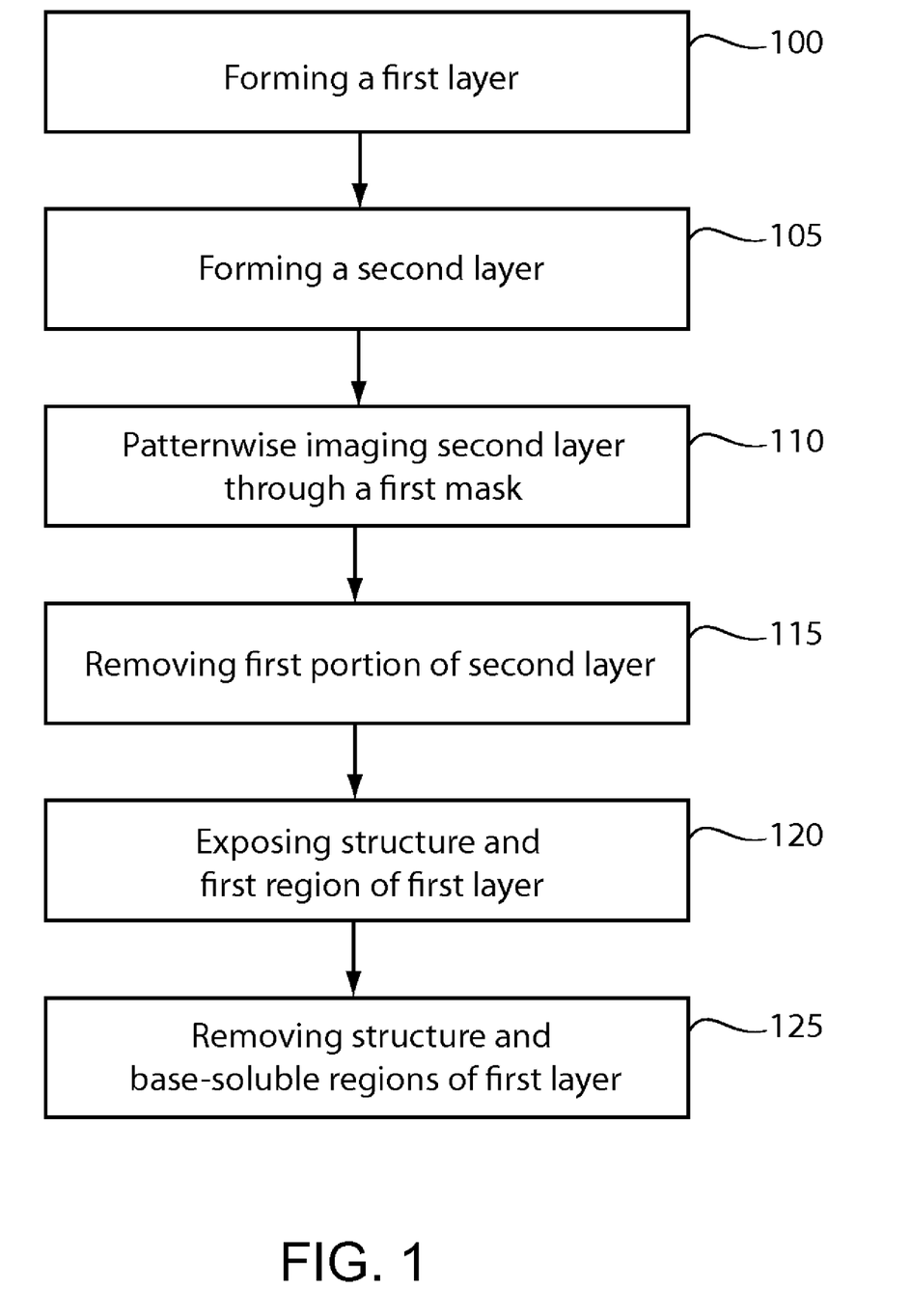
FIG. 1 is a flowchart illustrating a photolithography method, in accordance with embodiments of the present invention.

FIG. 1 is a flowchart illustrating a photolithography method. Step 100 comprises forming a first layer of a first photoresist onto a substrate. The first photoresist comprises a first polymer and a first photosensitive acid generator. The thickness of the first photoresist layer may be in a range from about 20 nanometers (nm) to about 400 nm, such as from about 50 nm to about 300 nm.

The first polymer of the first photoresist described above may comprise any polymer suitable for chemically amplified photoresists. The polymer may have a structure comprising at least one acid labile moiety or at least one base soluble group. For example, a polymer in a positive tone chemically amplified system may comprise at least one repeating unit having at least one acid labile protecting group which can be deprotected in an acid-catalyzed thermal baking process making the polymer substantially soluble in base developers. The polymers described herein may comprise a homopolymer, a copolymer, a terpolymer, a tetrapolymer, etc. and may comprise a polymer blend of two or more polymers.

The base soluble functional groups described herein may comprise, for example, a hydroxyl group, a carboxylic acid group, sulfonamide, dicarboxylmide, N-hydroxy dicarboxylmide, an amino group, an imino group, combinations thereof, and the like. In a chemically amplified resist system, a base soluble functional group of a compound may be protected by an acid labile protecting group to change the compound's dissolution rate from substantially soluble in developer to a substantially insoluble in the developer. During the acid catalyzed chemical amplification process, the protecting group may be removed from the structure in the exposed region or regions of the resist, thus regenerating the unprotected functional group, which may render the compound soluble in developer. The unexposed region or regions may remain insoluble in the developer. The acid catalyzed chemical amplification process may occur immediately following exposure to energy such as from radiation or a particle beam and may immediately follow a thermal bake. Examples of acid labile protecting groups include esters, carbonates, acetals, ketals, orthoester groups, combinations thereof, and the like. For example, the polymer of the photoresists described herein may comprise repeating units having at least one acid labile group selected from tertiary esters of methyladamantane, ethyladamantane, methylcyclopentane, ethylcyclopentane, methylcyohexane, ethylcyohexane, methylcycloheptane, ethylcyclohepatane, methylcyclooctane, ethylcyclooctane, and t-butyl groups.

In some embodiments, the first photoresist comprises a negative tone chemically amplified system, where the first polymer may comprise at least one repeating unit having at least one base soluble group which may allow the polymer to be substantially soluble in base developers. The polymer may be configured to crosslink or undergo a polarity change in an acid-catalyzed thermal baking process, thus making the first polymer substantially insoluble in base developers.

Step 105 comprises forming a second layer of a second photoresist directly onto the first layer of the first photoresist. The thickness of the second layer may be in a range from about 10 nm to about 200 nm, such as from about 20 nm to about 100 nm. The second photoresist comprises a second polymer and a second photosensitive acid generator. The second polymer may comprise at least one repeating unit having at least one phenyl moiety or phenolic moiety. The phenolic moiety absorbs radiation to which the polymer may be exposed, resulting in the polymer having an absorbance of greater than about 70% for the exposing radiation. In some embodiments, the exposing radiation may have a wavelength below about 248 nm, such as about 193 nm. The phenyl or phenolic moiety is not cleavable from the polymer structure via acid-catalyzed bond cleavage.

For example, the second polymer may comprise repeating units selected from the group consisting of:

wherein R is selected from the group consisting of hydrogen, halogens, alkyl groups, aromatic groups, and combinations thereof.

The second polymer may further comprise repeating units each having an acid labile moiety. The acid labile moiety may be selected from moieties such as esters, carbonates, acetals, ketals, orthoesters, and the like. For example the second polymer may further comprise repeating units of:

In some embodiments, the second polymer has a structure represented by:

(PHMOCH)

wherein m and n represent molar fractions of each repeating unit of said polymer. The subscripts m and n may each be in a range from about 0.05 to about 0.95. In one embodiment, n is about 0.75 and m is about 0.25.

Step 110 comprises patternwise imaging the second layer through a patterned mask, resulting exposing at least one first portion of the second layer to a first dose of radiation having a wavelength or range of wavelengths, wherein at least one second portion of said second layer is not exposed to the radiation. The second photosensitive acid generator produces an acid catalyst in the exposed at least one first portion of the second layer, resulting in rendering the exposed at least one first portion of the second layer soluble in aqueous base developer. The photolithographic mask may comprise a pattern of masked sections, which are essentially opaque to the radiation or impenetrable to the energetic particles, and unmasked sections which are essentially transparent to the radiation or penetrable to the energetic particles. The first dose of radiation may be in a range from about 1 millijoules/centimeter$^2$ (mj/cm$^2$) to about 8 mj/cm$^2$.

Step 115 comprises removing the at least one first portion of the second layer (rendered base-soluble in step 110), resulting in revealing at least one first region of the first layer directly beneath the at least one first portion of the second layer. The at least one second portion of the second layer remains after removing the at least one first portion of the second layer, resulting in forming a structure having masked regions comprising said remaining at least one second portion of the second layer and unmasked regions comprising gaps formed by the removing of the at least one first portion of said second layer.

The method may further comprise, after the patternwise imaging in step 110 and before removing the at least one first portion of the second layer of step 115, baking the second layer, the first layer and the substrate at a temperature in a range from about 50° C. to about 150° C. Baking may result in the exposed at least one region of said second layer becoming substantially soluble in aqueous base. For a chemically amplified resist system, baking after patternwise imaging may deprotect acid labile groups in the polymer, regenerating base soluble groups through an acid catalyzed amplification process, thus the baking may render the exposed regions of the resist substantially soluble in a developer, such as aqueous base.

Step 120 comprises exposing to a second dose of the radiation, the structure formed in step 115 and the at least one first region of the first layer, resulting in the first photosensitive acid generator producing an acid catalyst in the exposed at least one first region of the first layer and the second photosensitive acid generator producing an acid catalyst in the masked regions of the structure. The masked regions of the structure (comprising the at least one second portion of the second layer) shield from the radiation at least one second region of the first layer directly beneath the masked regions of the structure. The shielding results from the second polymer in the masked regions absorbing the radiation due to the presence of the at least one phenyl or phenolic moiety in the polymer, thus shielding the at least one second region of the first layer from the radiation. Due to the shielding by the masked regions, the first photosensitive acid generator does not produce a significant amount of acid in the at least one second region of the first layer. The second dose of radiation from step 120 may be higher than the first dose of radiation from step 110. In some embodiments, the second exposure described in step 120 comprises a flood exposure of the substrate and layers thereon.

After exposing the structure and the at least one first region of the first layer, and before removing the second layer and base-soluble regions of the first layer, the first layer and structure may be baked at a second temperature, resulting in the exposed at least one first region of the first layer and the masked regions of the structure becoming substantially soluble in aqueous base. Baking, after exposing the structure and the at least one first region of the first layer, may deprotect base soluble groups in the polymer in the masked regions of the structure, and deprotect acid labile groups in the at least one first region of the first layer, regenerating base soluble groups through an acid catalyzed amplification process, thus the baking may render the masked regions of the structure and the exposed at least one first region of the first layer substantially soluble in a developer, such as aqueous base. In some instances, it is possible to avoid the baking step since, for certain chemistries such as acetal and ketal chemistries, deprotection may proceed at room temperature. The second temperature may be in a range from about 50° C. to about 150° C., and may be higher than the first temperature.

Step 125 comprises removing the structure and base-soluble regions of the first layer. The base-soluble regions of said first layer may comprise the exposed at least one first region of the first layer, where the first layer comprises a positive photoresist and the acid catalyst renders the exposed at least one first region of the first layer substantially soluble in developer. The base-soluble regions of the first layer may comprise the at least one second region of the first layer directly beneath the at least one second portion of the second layer, where the first layer comprises a negative photoresist and the acid catalyst renders the exposed at least one first region of the first layer substantially insoluble in developer. Removing the structure and base-soluble regions of the first layer may comprise developing in a developer, where the layers are dissolved in the developer. The developers described herein may be organic-based, such as an organic solvent, or aqueous-based, such as an aqueous base developer such as tetramethylammonium hydroxide (TMAH) aqueous solution, for example. For example, removing the structure may comprise developing the structure in aqueous base, wherein the at least one first portion of the second layer is dissolved in the aqueous base.

Figure 2A:
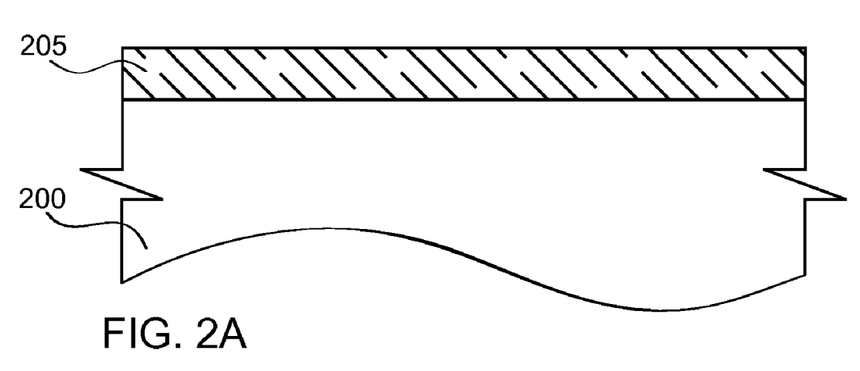
FIG. 2A is an illustration of a substrate after a first layer of a first photoresist has been formed thereon, in accordance with embodiments of the present invention.
Figure 2B:
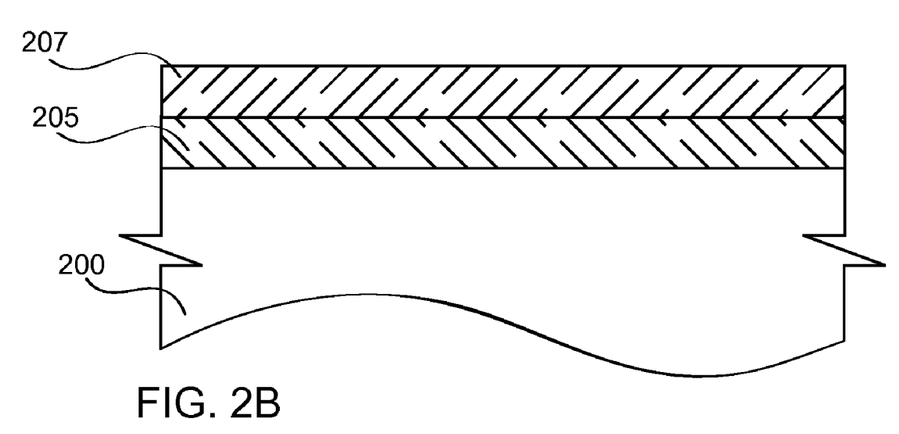
FIG. 2B is an illustration of the substrate of FIG. 2A after a second layer of a second photoresist has been formed directly onto the first layer of the first photoresist, in accordance with embodiments of the present invention.

FIG. 2A is an illustration of a substrate 200 after a first layer 205 of a first photoresist has been formed thereon. The first photoresist may comprise a first polymer and a first photosensitive acid generator, such as those described above for step 100 of FIG. 1. FIG. 2B is an illustration of the substrate 200 of FIG. 2A after a second layer 207 of a second photoresist has been formed directly onto the first layer 205 of the first photoresist. The second photoresist may comprise a second polymer and a second photosensitive acid generator, where the second polymer comprises at least one repeating units having at least one phenyl or phenolic moiety, such as described above in step 105 of FIG. 1.

Figure 2C:
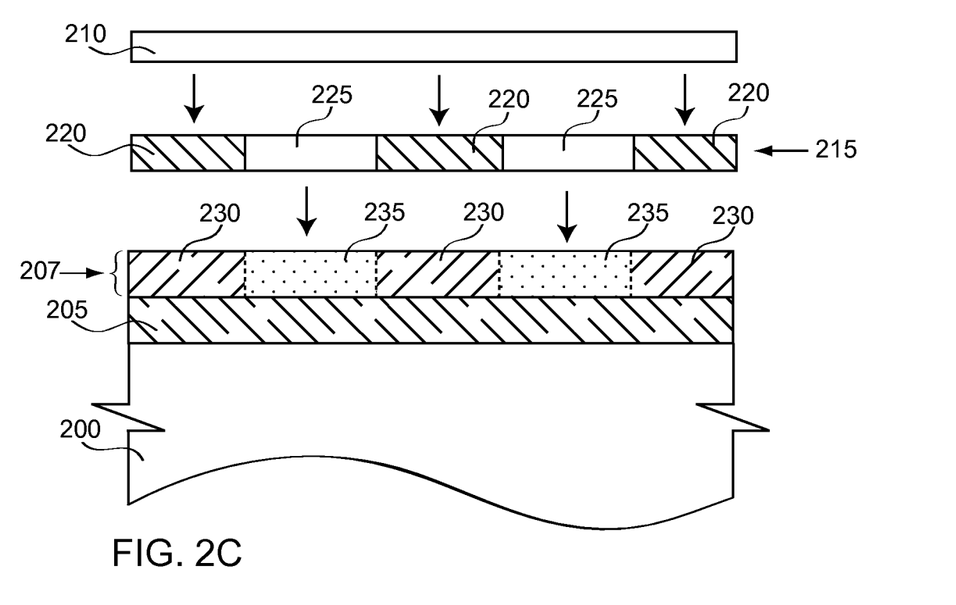
FIG. 2C is an illustration of patternwise imaging the second layer of FIG. 2B through a first mask, in accordance with embodiments of the present invention.

FIG. 2C is an illustration of patternwise imaging the second layer 207 of FIG. 2B through a first mask 215, resulting in exposing at least one first portion 235 of said second layer 207 to a first dose of radiation having a wavelength or range of wavelengths, resulting in the second photosensitive acid generator producing acid in the exposed at least one portion 235 of the second layer 207, such as described above in step 110 of FIG. 1. As illustrated in FIG. 2C, more than one portion of the second layer 207 may be exposed to the radiation. A radiation or particle beam source 210 may project radiation or energetic particles through the first patterned mask 215 onto the second layer 207. The first patterned mask 215 may have a pattern of masked sections 220 which are essentially opaque to the radiation or impenetrable to the energetic particles, and unmasked sections 225 which are essentially transparent to the radiation or penetrable to the energetic particles. Radiation or particles passing through the unmasked sections 225 may be transmitted to the second layer 207 to be absorbed in the exposed portion 235 of the second layer 207, resulting in the radiation or particles inducing the production of an acid catalyst by the second photosensitive acid generator in the exposed portion 235 of the second layer 207. Unexposed portions 230 of second layer 207 are not exposed to the radiation and may not produce an acid catalyst. Exposure to the radiation or energetic particles may render the exposed portion 235 soluble in a developer.

Figure 2D:
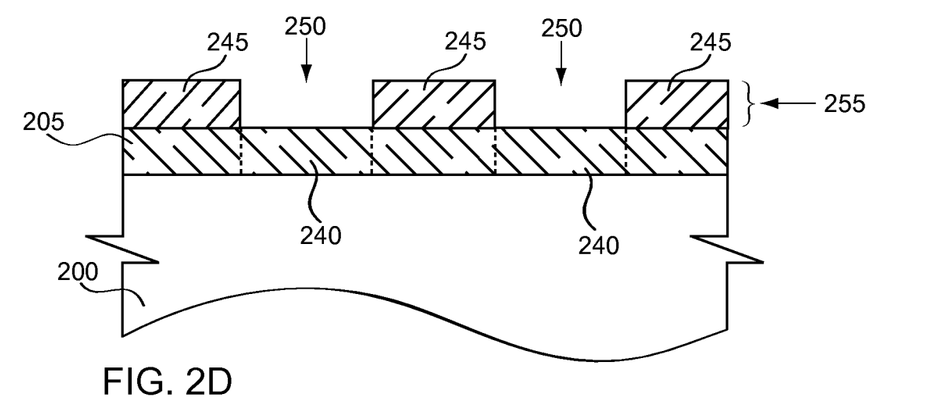
FIG. 2D is an illustration of the substrate and layers of FIG. 2C after removing base-soluble regions of the second layer, in accordance with embodiments of the present invention.

FIG. 2D is an illustration of the substrate and layers of FIG. 2C after removing base-soluble regions 235 of the second layer 207, resulting in revealing at least one at least one first region 240 of said first layer 205 directly beneath the removed at least one first portion 235 of the second layer 207 (see FIG. 2C), such as described above in step 115 of FIG. 1. The unexposed at least one second portion 230 of the second layer 207 remains following the removing, resulting in forming a structure 255 on the first layer 205, said structure 255 comprising opaque regions 245 and transparent regions 250. The opaque regions 245 may comprise the unexposed at least one second portion 230 of the second layer 207 of FIG. 2D remaining following the removal of base-soluble regions 235 of the second layer 207. The transparent regions 250 may comprise gaps formed by the removal of the base-soluble regions 235 of the second layer 207. The opaque regions 245 comprising the remaining unexposed at least one second portion 230 of the second layer 207 are substantially opaque to radiation, having an absorbance of greater than about 70% of the exposing radiation, wherein the transparent regions 250 are essentially transparent to the radiation.

Figure 2E:
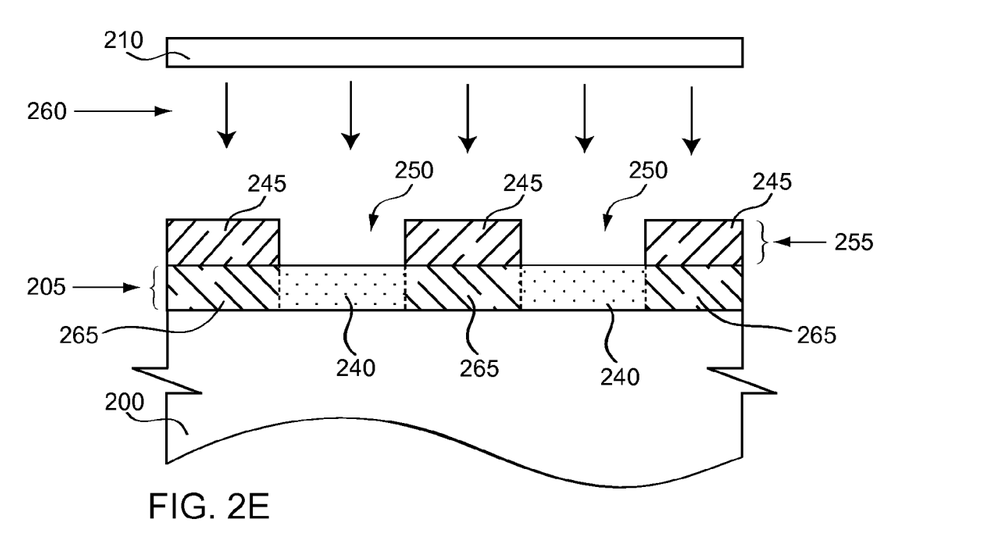
FIG. 2E is an illustration of exposing the structure and the at least one region of the first layer to a second dose of radiation, in accordance with embodiments of the present invention.

FIG. 2E is an illustration of exposing the structure 255 and the at least one region 240 of the first layer 205 to a second dose of the radiation, wherein a beam of the radiation 260 passes through the transparent regions 250 of structure 255. The second dose of radiation may have the same wavelength or range of wavelengths as the first dose of radiation. The structure 255 may act as a near field mask, wherein opaque regions 245 shield from the radiation at least one second region 265 of the first layer 205 directly beneath the opaque regions 245, resulting in the first photosensitive acid generator producing an acid catalyst in the exposed at least one first region 240 of the first layer 205 and the second photosensitive acid generator producing an acid catalyst in the opaque regions 245. The first dose of said radiation may be lower than the second dose of said radiation.

Figure 2F:
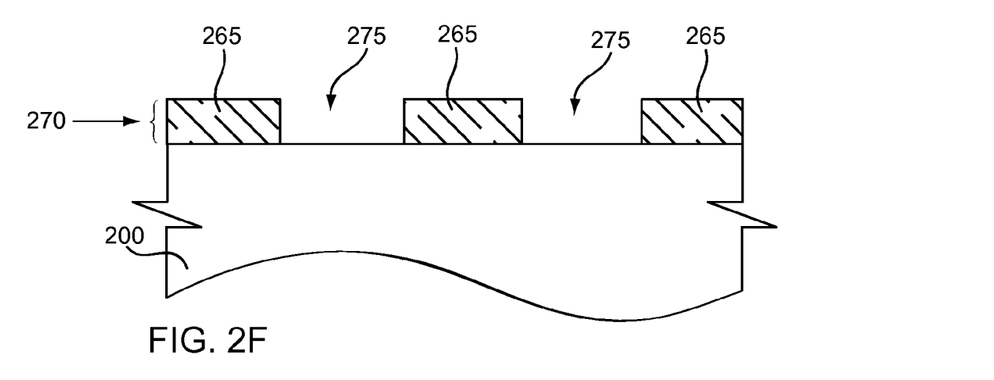
FIG. 2F is an illustration of the substrate and layers of FIG. 2E after removing the structure and base-soluble regions of the first layer, in accordance with embodiments of the present invention.

FIG. 2F is an illustration of the substrate and layers of FIG. 2E after removing the structure 255 and base-soluble regions of the first layer 205, wherein a relief pattern 270 from the first layer 205 remains following the removing, wherein the relief pattern 270 comprises the at least one second region 265 of the first layer 205 remaining on the substrate and gaps 275 formed by the removal of the at least one first region 240 of the first layer 205. Base-soluble regions of the first layer may comprise the exposed at least one first region 240 of the first layer 205. In other embodiments, such as where the first photoresist is a negative tone resist, base-soluble regions may comprise the unexposed at least one second region 265 of the first layer 205, which may be removed following exposure to radiation.

The relief patterns described herein may be transferred to the substrate. If the substrate comprises an antireflective coating (ARC) and/or planarizing underlayer onto which the photoresist film has been formed, the ARC and/or planarizing underlayer may be removed at the gaps in the patterned photoresist layer to expose portions of the substrate. For example, the antireflective coating and/or planarizing underlayer may be removed by etching. Once the desired portions of the substrate are exposed, the relief pattern (e.g. the pattern of gaps between remaining portions after developing) may be transferred to portions of the substrate. Transferring the pattern may comprise, for example, etching, such as reactive ion etching (RIE), depositing (such as vapor deposition or electroplating) a material (such as a dielectric, a metal, a ceramic or a semiconductor) onto the substrate in a gap in the exposed photoresist film, by implanting dopants into the substrate material in a gap in the exposed photoresist film, or by a combination of one or more of these methods.

EXAMPLE 1

Formulation of IML-2 Photoresist

Approximately 20 grams (g) of polyhydroxystyrene partially protected (25% of the phenol) with methoxycyclohexene (PHMOCH) in PGMEA was transferred to a 120 milliliter (ml) glass bottle. Approximately 80 g of hexane was added to the solution, and the glass bottle with its cap tightly closed was shaken vigorously to form a coagulated polymer on the bottom of the bottle. The solvents were decanted. This coagulated polymer was washed with hexane using the same procedure three more times. The solid PHMOCH product was then dried in a vacuum oven at approximately 45° C. for 24 hours.

The IML-2 resist formulation was obtained by mixing PHMOCH with 0.28 weight % (wt %, all wt % values relative to relative to the polymer) tetrabutyl ammonium hydroxide and 1.9 wt % triphenylsulfonium perfluorobutanesulfonate (TPS PFBUS) and between 200 and 1000 ppm of FLUORAD™ FC-430 surfactant (available from 3M Company), in 4-methyl-2-pentanol. The total solid weight content in the solution was about 3%.

EXAMPLE 2

Lithographic Study of IML-2 Resist

An Argon Fluoride (ArF) resist, AR2073 (from Japan synthetic Rubber Co.) was spin coated onto a 12 inch silicon wafer which had an approximately 42 nanometers (nm) thickness coating of the Rohm & Haas bottom anti-reflective coating (BARC) named AR40A. The resist was post-applying baked (PAB) at about 110° C. for about 60 seconds. Then the resist (IML-2 formulated in Example 1) was spin coated on top of the ArF resist coated wafer, post-applying baked (PAB) at about 90° C. for about 60 seconds. The wafer was exposed to 193 nm wavelength light on an ASML stepper (0.85 NA, 0.8 outer and 0.5 inner σ Annular illumination), with first reticle, at the dose from 2.0 to 6.0 millijoules/centimeter$^2$ (mj/cm$^2$). The wafer was then post-exposure baked (PEB) at about 100° C. for about 60 seconds. The film was then developed using a single puddle develop process for about 30 seconds with 0.263 N tetramethylammonium hydroxide (TMAH) developer (Moses Lake's AD-10). The wafer was again exposed to 193 nanometer (nm) wavelength light on an ASML stepper (0.85 NA, 0.8 outer and 0.5 inner σ Annular illumination), with no reticle, at the dose from 6 to 10 mj/cm$^2$. The wafer was then post-exposure baked (PEB) at about 120° C. for about 60 seconds. The film was then developed using a single puddle develop process for about 30 seconds with 0.263 N TMAH developer (Moses Lake's AD-10). Sharp images of 130 nm trenches and 170 nm lines were resolved on the ArF resist.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed:
1. A photolithography method comprising:
forming a first layer of a first photoresist onto a substrate, said first photoresist comprising a first polymer and a first photosensitive acid generator;
forming a second layer of a second photoresist directly onto said first layer, said second photoresist comprising a second polymer and a second photosensitive acid generator, said second polymer having at least one repeating unit comprising a moiety selected from the group consisting of:

wherein R is selected from the group consisting of hydrogen, halogens, alkyl groups, aromatic groups, and combinations thereof, and wherein R1 is selected from the group consisting of hydrogen. halogens, alkyl groups, and combinations thereof;
patternwise imaging said second layer through a patterned mask, resulting in exposing at least one first portion of said second layer to a first dose of radiation having a wavelength or range of wavelengths, wherein at least one second portion of said second layer is not exposed to said radiation, said second photosensitive acid generator producing an acid catalyst in said exposed at least one first portion of said second layer, resulting in rendering said exposed first portion soluble in aqueous base developer;
removing said at least one first portion of said second layer, resulting in revealing at least one first region of said first layer directly beneath said first portion, said at least one second portion of said second layer remaining after said removing resulting in forming a structure having masked regions comprising said at least one second portion of said second layer and unmasked regions comprising gaps formed by said removing said at least one first portion of said second layer;
exposing said structure and said at least one first region of said first layer to a second dose of said radiation, said masked regions of said structure shielding, from said second dose of radiation, at least one second region of said first layer directly beneath said masked regions, resulting in said first photosensitive acid generator producing an acid catalyst in said exposed at least one first region of said first layer and said second photosensitive acid generator producing an acid catalyst in said structure; and
removing said structure and base-soluble regions of said first layer.
2. The method of claim 1 wherein said base-soluble regions of said first layer comprise said exposed at least one first region of said first layer.

3. The method of claim 1, wherein said base-soluble regions of said first layer comprise said at least one second region of said first layer directly beneath said masked regions.

4. The method of claim 1, wherein said removing said at least one first portion of said second layer comprises developing said second layer in aqueous base, wherein said at least one first portion of said second layer is dissolved in said aqueous base.

5. The method of claim 1, wherein said second polymer further comprises repeating units each having an acid labile moiety.

6. The method of claim 5, wherein said acid labile moiety is selected from the group consisting of esters, carbonates, acetals, ketals, and orthoesters.

7. The method of claim 1, wherein second polymer further comprises repeating units of:

8. The method of claim 1, wherein said shielding from said radiation comprises absorbing said radiation by said second polymer.

9. The method of claim 1, wherein said second polymer has a structure represented by:

wherein m and n represent molar fractions of each repeating unit of said polymer.

10. The method of claim 1, wherein said second dose is greater than said first dose.

11. The method of claim 1, wherein said radiation has a wavelength of about 193 nanometers.

12. The method of claim 1, said method further comprising:
after said patternwise imaging and before said removing said at least one first portion of said second layer, baking said second layer, said first layer and said substrate at a temperature in a range from about 50° C. to about 150° C.

* * * * *